United States Patent
Sadakane et al.

(10) Patent No.: US 7,418,688 B2
(45) Date of Patent: Aug. 26, 2008

(54) ROUTING ANALYSIS METHOD, LOGIC SYNTHESIS METHOD AND CIRCUIT PARTITIONING METHOD FOR INTEGRATED CIRCUIT

(75) Inventors: Toshiyuki Sadakane, Tokyo (JP); Ken Saito, Tokyo (JP); Yoshio Inoue, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 340 days.

(21) Appl. No.: 11/111,720

(22) Filed: Apr. 22, 2005

(65) Prior Publication Data

US 2005/0246676 A1 Nov. 3, 2005

(30) Foreign Application Priority Data

Apr. 28, 2004 (JP) ............................. 2004-132748

(51) Int. Cl.
*G06F 17/50* (2006.01)
(52) U.S. Cl. .................... 716/12; 716/4; 716/5; 716/7; 716/9
(58) Field of Classification Search ................ 716/2, 716/4–7, 9–18
See application file for complete search history.

(56) References Cited

U.S. PATENT DOCUMENTS 7,200,827 B1 * 4/2007 Ku et al. ..................... 716/9
2002/0133797 A1 * 9/2002 Sasagawa et al. ............. 716/9
2004/0040007 A1 * 2/2004 Harn ........................... 716/11

FOREIGN PATENT DOCUMENTS

JP 10-116915 5/1998

* cited by examiner

*Primary Examiner*—Paul Dinh
(74) *Attorney, Agent, or Firm*—Buchanan Ingersoll & Rooney PC

(57) ABSTRACT

The present invention relates to a routing analysis method for performing a routing analysis on an integrated circuit from a netlist which is information on a plurality of cells constituting the integrated circuit and routes connecting the cells, and the routing analysis method comprises a step (Step 1) of obtaining the sum of areas of a plurality of cells, the number of cells or the number of routes connecting the cells from the netlist, to be defined as a constant C, and calculating a layout area S which is an area of a square layout region, by dividing the constant C by a predetermined constant U, a step (Step 2) of calculating a total route length L by multiplying a half perimeter length H of the layout region having the layout area S obtained in Step 1 by a predetermined coefficient α, and a step (Step 3) of calculating a routing difficulty index by dividing the total route length L by the layout area S. Thus, the present invention provides a routing analysis method for an integrated circuit, which, allows calculation of routing difficulty index with high accuracy of prediction.

6 Claims, 7 Drawing Sheets

F I G . 1
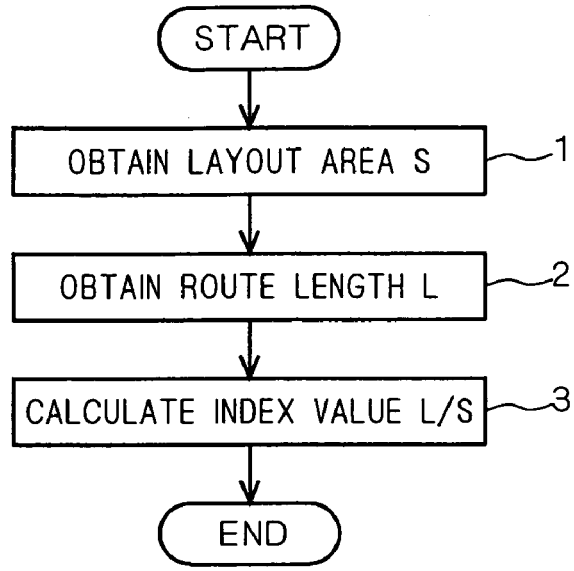
F I G . 2
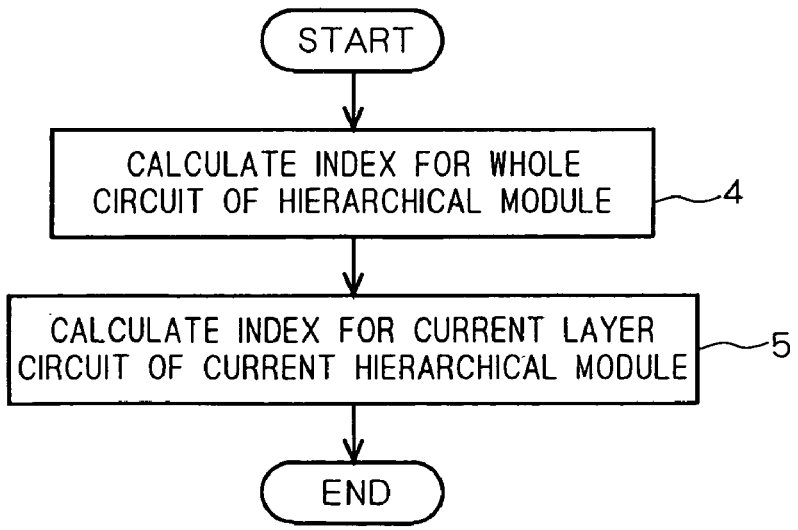

ROUTING ANALYSIS METHOD, LOGIC SYNTHESIS METHOD AND CIRCUIT PARTITIONING METHOD FOR INTEGRATED CIRCUIT

BACKGROUND OF THE INVENTION

1. Field of the Invention

The present invention relates to a routing analysis method, a logic synthesis method and a circuit partitioning method for an integrated circuit.

2. Description of the Background Art

The present routing analysis method for an integrated circuit is a method for calculating a routing difficulty index which indicates difficulty in routing in a case where routes are placed in a layout region of the integrated circuit, from a netlist which is information on cells constituting the integrated circuit and connection of the cells. As a conventional method for calculating the routing difficulty index from the netlist, a method of calculating the number of nets and the number of connections between terminals, or calculating a ratio of the number of nets and the number of connections between terminals to the number of cells has been proposed.

The general routing analysis method or the like is disclosed in, for example, Japanese Patent Application Laid Open Gazette No. 10-116915 (Patent Document 1).

The routing difficulty index obtained from the netlist, conventionally, indicates the number of nets and the number of connections between terminals, or a ratio of the number of nets and the number of connections between terminals to the number of cells. Even if the number of nets and the number of connections between terminals are large in the netlist, however, there is a case where the difficulty in an actual routing is low since the length of a route which is placed shorter than a predicted route length. Therefore, the conventional routing difficulty index has a problem of low accuracy of prediction.

SUMMARY OF THE INVENTION

It is an object of the present invention to provide a routing analysis method for an integrated circuit, which allows calculation of routing difficulty index with high accuracy of prediction.

The present invention is intended for a routing analysis method for performing a routing analysis on an integrated circuit from a netlist which is information on a plurality of cells constituting the integrated circuit and routes connecting the plurality of cells. According to a first aspect of the present invention, the routing analysis method includes the following steps (a), (b) and (c). The step (a) is to obtain the sum of areas of the plurality of cells, the number of the plurality of cells or the number of the routes connecting the plurality of cells from the netlist, to be defined as a constant C, and to calculate a layout area S which is an area of a layout region, by dividing the constant C by a predetermined constant U. The step (b) is to calculate a total route length L by multiplying a predetermined perimeter length H of the layout region having the layout area S obtained in the step (a) by a predetermined coefficient α. The step (c) is to calculate a routing difficulty index by dividing the total route length L by the layout area S.

The routing analysis method for an integrated circuit of the present invention makes it possible to estimate congestion of routes with higher accuracy as compared with a case where the routing difficulty index merely indicates the number of nets and the number of connections between terminals.

The present invention is also intended for a logic synthesis method for generating a netlist of an integrated circuit. According to a second aspect of the present invention, when the integrated circuit consists of a plurality of hierarchical modules and a logically-synthesized netlist is described hierarchically, a whole circuit of the hierarchical module is a circuit including respective circuits in current one of the plurality of hierarchical modules and the hierarchical modules positioned therebelow, and the logic synthesis method includes the following steps (p) and (q). The step (p) is to calculate a routing difficulty index on a whole circuit of the hierarchical module in each hierarchy, and then calculate the routing difficulty index on a current layer circuit of the current hierarchical module by subtracting values obtained by multiplying the routing difficulty indices for whole circuits of the hierarchical modules positioned therebelow than the current hierarchical module by predetermined weighting factors from the routing difficulty index on the whole circuit of the hierarchical module. The step (q) is to reconstitute a circuit configuration of a circuit of the hierarchical module, which has the routing difficulty index larger than a predetermined value, and then perform a logic synthesis again to generate the netlist.

In the logic synthesis method of the present invention, since a circuit configuration of a circuit of the hierarchical module, which has the routing difficulty index larger than a predetermined value, is reconstituted, it is possible to prevent congestion of routes which locally occurs in a step of generating the netlist.

The present invention is further intended for a circuit partitioning method for partitioning an integrated circuit which consists of a plurality of hierarchical modules into a plurality of partial circuits. According to a third aspect of the present invention, the circuit partitioning method includes the following steps (r) through (t). The step (r) is to calculate a layout area S of the hierarchical module in each hierarchy, which includes the following steps (r1) through (r4). The step (r1) is to store the number of grids occupied by a cell which is placed in the hierarchical module, the number of grids Lg per unit length of a route placed in the hierarchical module, the number of grids Sg per unit area and a grid usage ratio GU indicating a ratio of the number of grids occupied by the cells and the routes to the number of grids occupying a layout region into a table. The step (r2) is to calculate the total number of grids GP used by a plurality of the cells from a list of cells and the number of grids occupied by a cell. The step (r3) is to calculate the total number of grids GR used by the routes from connection information of the routes and the number of grids Lg. The step (r4) is to obtain the layout area S by calculation of (GP+GR)/GU/Sg from the number of grids Sg per unit area, the grid usage ratio GU and the total numbers of grids GP and GR. The step (s) is to change the layout areas S of the hierarchical modules positioned lower than the current hierarchical module in each hierarchy so that the sum of the layout areas S of the hierarchical modules positioned lower becomes equal to the layout area S of the current hierarchical module. The step (t) is to perform circuit partitioning on the integrated circuit after the step (s).

In the circuit partitioning method of the present invention, since the integrated circuit is partitioned into a plurality of partial circuits on the basis of the layout areas after changing the layout areas of a plurality of hierarchical modules which are positioned lower, it is possible to reduce necessity of performing repartition of the circuit or the like as compared with the conventional circuit partitioning on the basis of a cell area.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart showing a routing analysis method for an integrated circuit in accordance with a first preferred embodiment of the present invention;

FIG. 2 is a flowchart showing a routing analysis method for an integrated circuit in accordance with a second preferred embodiment of the present invention;

DESCRIPTION OF THE PREFERRED EMBODIMENTS

The First Preferred Embodiment

Figure 3:
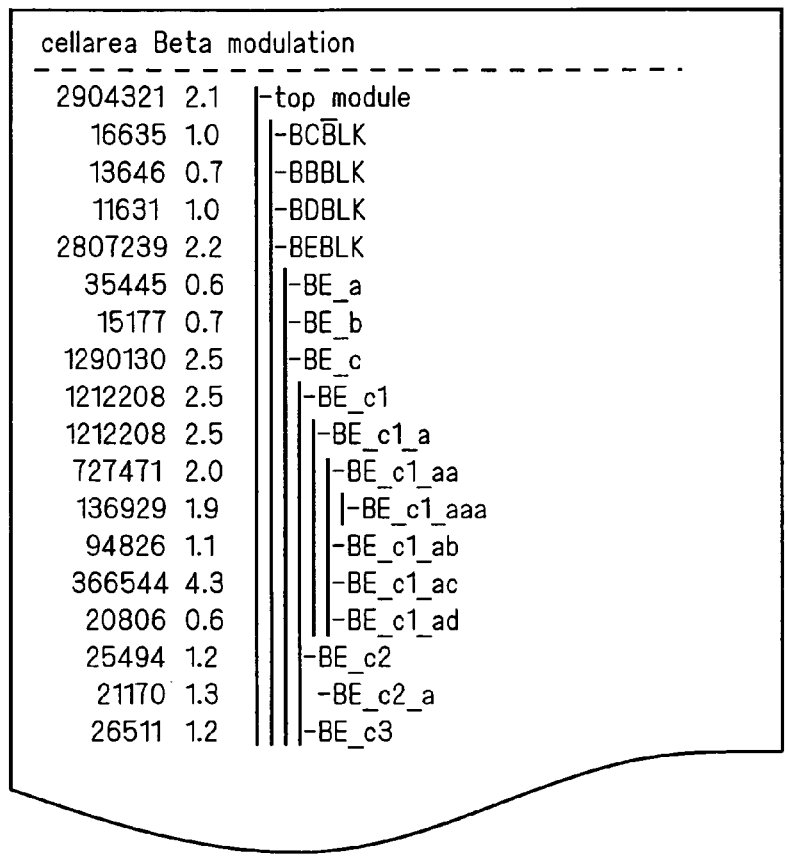
FIG. 3 is a view showing a result of routing analysis for an integrated circuit in accordance with the second preferred embodiment of the present invention.

The routing analysis method for an integrated circuit in accordance with the first preferred embodiment is a method for calculating a routing difficulty index which indicates difficulty in routing in a case where routes are placed in a layout region of the integrated circuit from a netlist which is information on cells constituting the integrated circuit and connection of the cells. FIG. 1 is a flowchart showing the routing analysis method for an integrated circuit in accordance with the first preferred embodiment.

Referring to FIG. 1, first in Step 1, an area of the layout region (hereinafter, also referred to as layout area) is calculated. In a method for calculating the layout area, a layout area S, which is an area of a square layout region, is obtained by dividing a cell area C, which is obtained by adding up areas of a plurality of cells constituting the integrated circuit, by a predetermined constant U. In summary, the layout area S can be obtained from the equation of S=C/U. In the above discussion, it is assumed that the layout region is a square as an example; however, application of the present invention is not limited to this case (the same applies to the following).

Herein, the predetermined constant U is a constant indicating the degree of integration of the integrated circuit, and in this method for calculating the routing difficulty index, the same value is used regardless of the integrated circuit. The predetermined constant U is a numeric value indicating a ratio of the area of cells which are allowed to be arranged in a layout region to a unit area. Further, the layout area can be obtained from the number of nets and the number of connections between terminals, instead of the cell area C.

After the layout area S is obtained by the above method, in Step 2 of the flowchart of FIG. 1, a total route length L is calculated. In Step 2, the total route length L is calculated by multiplying a half perimeter length H of the layout region by a predetermined coefficient α. Herein, the half perimeter length H of the layout region indicates the length of two sides of the square layout region. In the above discussion, though it is assumed that the predetermined perimeter length is the half perimeter length H, the predetermined perimeter length of the present invention is not limited to this but may be an entire perimeter length.

Assuming that cells are roughly arranged in a layout region having a predetermined half perimeter length H0, the predetermined coefficient α is calculated by dividing a total route length L0, which is obtained by measurement, by the predetermined half perimeter length H0. In other words, the predetermined coefficient α is a proportionality constant of the total route length L and the half perimeter length H. The coefficient α is obtained by calculation using the total route length L0 and the half perimeter length H0 which are obtained in a case where cells are roughly arranged in a given layout region. Herein, to obtain the route length with the cells roughly arranged means estimation of the route length on the basis of arrangement positions of the cells in the case where the cells described in the netlist are arranged in the layout region. Among methods for estimating the route length are a method of measuring the lengths of routes which are placed or a method of obtaining an estimated route length from arrangement position coordinates of cells instead of placing the routes (for example, where a minimum rectangle including arrangement coordinates of all the cells connected by the routes is made and then the half perimeter length of the rectangle is obtained).

As a method for obtaining the predetermined coefficient α other than the above, for example, the predetermined coefficient α can be obtained by using the fact that the predetermined coefficient α is a function of the amount of routes to be required per unit area of a circuit. Specifically, using the number of connections between terminals PP of a circuit which indicates the amount of routes in the circuit and a cell gross area CS, the predetermined coefficient α can be expressed as $\alpha = \beta \cdot PP^{\gamma}/CS^{1/sqrt(\gamma)} + \delta \cdot sqrt(CS)$ as an empirical formula. Herein, sqrt(X) represents the square root of X. As a result, the predetermined coefficient α can be obtained on the basis of this formula. In this formula, β, γ and δ are coefficients which are empirically determined.

Next, in Step 3 of the flowchart of FIG. 1, the routing difficulty index is calculated by dividing the total route length L obtained in Step 2 by the layout area S obtained in Step 1. In summary, the routing difficulty index=L/S in the first preferred embodiment. The routing difficulty index obtained in the first preferred embodiment is an index which indicates the length of routes placed per unit area in a case where cells and routes are arranged in the square layout region with an integration degree of U. In other words, the routing difficulty index is an index which indicates the length of routes to be required per unit area, and the index can represent difficulty in routing in an integrated circuit or complexity of connection.

In the first preferred embodiment, since the routing difficulty index is obtained by using the total route length L which is calculated on the basis of the result of rough layout of cells, it is possible to reflect the result after routing more and improve the accuracy as compared with the conventional case where the routing difficulty index is obtained by merely using the number of nets and the number of connections between terminals.

Thus, in the analysis method for an integrated circuit of the first preferred embodiment, since the routing difficulty index is calculated by dividing the total route length L, which is obtained on the basis of the result of a rough layout of cells, by the layout area S, it is possible to estimate the congestion of routes with higher accuracy as compared with the case where the routing difficulty index is obtained by merely using the number of nets and the number of connections between terminals. If the routing difficulty index can be obtained with high accuracy, it becomes possible to correct the netlist if the routing difficulty index indicates a high value or easily decide measures such as expansion in area of the layout region, and this allows placement and routing design for an integrated circuit, avoiding congestion of routes or route short.

The Second Preferred Embodiment

The second preferred embodiment is a method of performing a routing analysis on an integrated circuit which consists of a plurality of hierarchical modules from the netlist which is described hierarchically. FIG. 2 is a flowchart showing the routing analysis method for an integrated circuit in accordance with the second preferred embodiment.

Referring to FIG. 2, first in Step 4, the routing difficulty index is calculated on a whole circuit of the hierarchical module in each hierarchy on the basis of the method of the first preferred embodiment. Herein, the whole circuit of the hierarchical module refers to a circuit including respective circuits in one of the hierarchical modules (current hierarchical module) for which the routing difficulty index is calculated and the hierarchical modules positioned therebelow.

Specifically discussing, if the integrated circuit consists of a hierarchical module M, a hierarchical module M1 positioned below the hierarchical module M and a hierarchical module M2 positioned below the hierarchical module M1, a whole circuit of the hierarchical module M includes circuits of the hierarchical modules M1 and M2. Further, a whole circuit of the hierarchical module M1 includes the circuit of the hierarchical module M2.

In Step 4, the routing difficulty index is calculated on a whole circuit of each hierarchical module. In the second preferred embodiment, the method for calculating the routing difficulty index is not limited to that of the first preferred embodiment but may be the conventional calculation method. In the above specific case, a routing difficulty index $\beta$ for the whole circuit of the hierarchical module M, a routing difficulty index $\beta 1$ for the whole circuit of the hierarchical module M1 and a routing difficulty index $\beta 2$ for the whole circuit of the hierarchical module M2 are calculated.

Next, in each hierarchy, a value is calculated by subtracting values obtained by multiplying the routing difficulty indices for whole circuits of the hierarchical modules positioned lower than the current hierarchical module by predetermined weighting factors from the routing difficulty index for the whole circuit of the current hierarchical module. The calculated value is a routing difficulty index for a current layer circuit of the current hierarchical module in each hierarchy (Step 5). Herein, the current hierarchical module refers to the hierarchical module for which the routing difficulty index is calculated.

A specific discussion will be made, assuming that a routing difficulty index for a whole circuit of the hierarchical module M is $\beta$ and a module area of the hierarchical module M is MS. The module area refers to the sum of areas of cells belonging to the hierarchical module. Further, it is assumed that there are hierarchical modules M1 and M2 positioned lower than the hierarchical module M, and respective routing difficulty indices are $\beta 1$ and $\beta 2$ and respective module areas are MS1 and MS2. In this case, a routing difficulty index $\beta T$ for a current layer circuit of the current hierarchical module M is calculated as $\beta T = \beta \times MS - \beta 1 \times MS1 - \beta 2 \times MS2$. In the above case, though the predetermined weighting factors are MS, MS1 and MS2, the predetermined weighting factors of the second preferred embodiment are not limited to these but other weighting factors may be used.

FIG. 3 is a view showing a list of calculation results obtained by the routing analysis method for an integrated circuit in accordance with the second preferred embodiment. In FIG. 3, the calculation result of one hierarchical module is shown in one line, and a module area, a routing difficulty index, a relation of hierarchical structure and a module name are described from the left side in each line.

Herein, the respective products of the routing difficulty indices and the module areas, $\beta \times MS$, $\beta 1 \times MS1$ and $\beta 2 \times MS2$, represent the route lengths in a case where the hierarchical modules M, M1 and M2 are arranged to have the module areas MS, MS1 and MS2. Therefore, when the hierarchical module M is arranged in a square layout region to have a certain degree of integration and the hierarchical module M and the lower hierarchical modules M1 and M2 have the module areas MS, MS1 and MS2, respectively, the routing difficulty index $\beta T$ for the current layer circuit represents a route length per unit area in the current layer circuit which is obtained by removing the circuits in lower layers from the whole circuit of the hierarchical module M. In other words, the routing difficulty index $\beta T$ for the current layer circuit calculated in the second preferred embodiment is thought to have validity as an index indicating difficulty in routing in the current layer circuit of the current hierarchical module. It is assumed, however, that the hierarchical modules M1 and M2 are arranged collectively in a certain region.

Thus, in the routing analysis method for an integrated circuit of the second preferred embodiment, since the routing difficulty index for the current layer circuit of the current hierarchical module is calculated, it is possible to estimate congestion of routes with higher accuracy as compared with the case where the routing difficulty index for a circuit includes all the hierarchies. Further, since the routing difficulty indices for the whole circuit and the current layer circuit of the current hierarchical module in each hierarchy can be obtained with high accuracy, it becomes possible to correct the netlist on the hierarchical module for which the routing difficulty index indicates a high value or perform production of a floor plan having no congestion of routes and relocation of the cells, and this allows placement and routing design for an integrated circuit, avoiding congestion of routes or route short.

The Third Preferred Embodiment

In the first preferred embodiment, the total route length L is obtained by multiplying the half perimeter length H in the layout region by the predetermined coefficient $\alpha$. The predetermined coefficient α is obtained by dividing the total route length L0 obtained by measurement by the predetermined half perimeter length H0 where cells are roughly arranged in the layout region having the predetermined half perimeter length H0.

In the third preferred embodiment, if cells are roughly arranged in the layout area of the layout region having the predetermined half perimeter length H0, a route length L0n on each net is obtained, instead of calculating the total route length L0. Then, a predetermined coefficient αn on each net is calculated by dividing the route length L0n on each net by the predetermined half perimeter length H0. A route length Ln on each net can be calculated by multiplying the predetermined coefficient αn on each net by the half perimeter length H in the object layout region.

The total route length L of an object integrated circuit can be obtained by integrating the route lengths Ln of all the nets. The routing difficulty index can be calculated by using the total route length L in the method of the first preferred embodiment.

Figure 4:
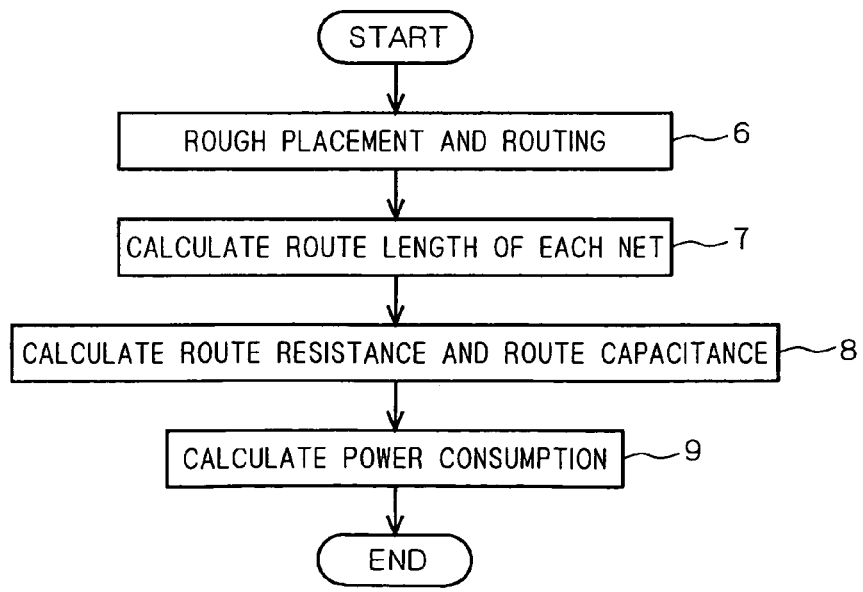
FIG. 4 is a flowchart showing a routing analysis method for an integrated circuit in accordance with a third preferred embodiment of the present invention.

Further in the third preferred embodiment, other than calculation of the routing difficulty index, it is possible to add a method of obtaining power consumption of the integrated circuit on the basis of the route length Ln on each net to the routing analysis method. FIG. 4 is a flowchart showing a method of obtaining the power consumption of the integrated circuit in accordance with the third preferred embodiment.

First, in Step 6 of the flowchart of FIG. 4, the route length L0n on each net in a case where cells are roughly arranged in the layout region having the half perimeter length H0 is calculated. With this, the predetermined coefficient αn on each net can be obtained.

Next, the route length Ln on each net in a case where routes are placed in the integrated circuit which includes the layout region having the half perimeter length of H is obtained by calculation of Ln=αn×H (Step 7). A route resistance and a route capacitance are obtained on the basis of the calculated route length Ln on each net (Step 8). As an exemplary method, the route resistance can be calculated by multiplying a route resistance value Rs per unit length of a route by the route length Ln of each net. Similarly, the route capacitance can be calculated by multiplying a route capacitance value Cs per unit length of a route by the route length Ln of each net. The route resistance value Rs and the route capacitance value Cs per unit length of a route are stored in a table in advance.

Next, the power consumption is calculated on the basis of the calculated route resistance and route capacitance (Step 9). For example, the power consumption can be calculated by integrating power consumptions Pc of all the cells and power consumptions Pw of all the net routes. Herein, the power consumption Pc of a cell can be obtained from a capacitance Cw of a route connected to an output terminal. Specifically, Pc=F(Cw). Herein, the function F is a function representing a relation between the capacitance Cw of the route connected to the output terminal and the power consumption Pc and stored in a table in advance. The power consumption Pw of a net route can be obtained by calculation of $Pw=\frac{1}{2} \times f \times C \times V^2$, where C, V and f represent a route capacitance, a power supply voltage and a toggle rate (the number of changes of a signal per one second), respectively.

To obtain the power consumption, conventionally, routes are actually placed and then calculation is performed. Therefore, it takes a long time to obtain the power consumption and there arises a problem of longer term for design since it needs time to find a problem of power consumption. Further, though there is a method of calculating the power consumption from the total route length by using a route load model instead of actual placement of routes, this method does not allow consideration of inherent characteristics of the netlist and therefore the accuracy is disadvantageously lowered. In the third preferred embodiment of the present invention, however, since the power consumption can be obtained on the basis of the rough placement prior to actual route placement, it is possible to shorten the term for design. Further, in the present preferred embodiment, the power consumption is calculated on the basis of the routes of each net, instead of calculation of the power consumption on the basis of the total route length, and therefore it is possible to consider the inherent characteristics of the net and perform calculation of the power consumption with high accuracy.

Thus, in the third preferred embodiment of the present invention, since the total route length L is obtained after calculation of the route length Ln of each net, it is possible to calculate the power consumption with higher accuracy as compared with calculation of the power consumption on the basis of the total route length. Though the rough layout is performed to obtain the predetermined coefficient αn on each net in the present preferred embodiment, the rough layout has only to be performed on a layout region having an adequate size and does not have to be performed on the layout region having a size to be measured, unlike in the conventional case. Therefore, the present preferred embodiment can be used in the initial stage of design where the size of the layout region is not determined yet and allows estimation of the power consumption with high accuracy.

The Fourth Preferred Embodiment

Figure 5:
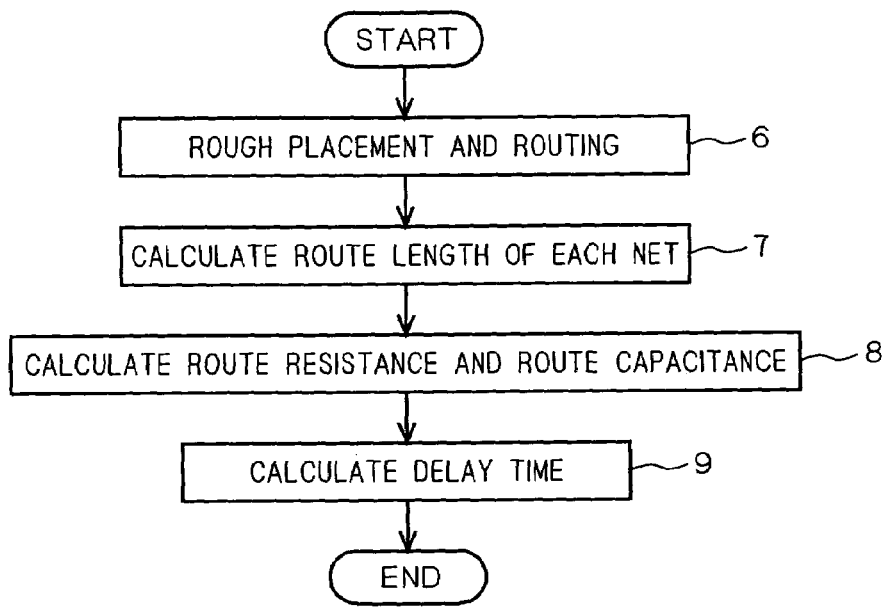
FIG. 5 is a flowchart showing a routing analysis method for an integrated circuit in accordance with a fourth preferred embodiment of the present invention.

Also in the fourth preferred embodiment of the present invention, like in the third preferred embodiment, it is possible to add a method of obtaining a delay time on the basis of the route length Ln of each net to the routing analysis method. FIG. 5 is a flowchart showing a method of obtaining a delay time for an integrated circuit in accordance with the fourth preferred embodiment.

In FIG. 5, the steps identical to those in FIG. 4 are represented by the same reference numerals. Step 6 to Step 8 are identical to those in the third preferred embodiment and therefore detailed discussion thereof will be omitted. In the fourth preferred embodiment, the delay time for an integrated circuit is obtained on the basis of the route resistance and the route capacitance which are calculated in Step 8 (Step 10). For example, a delay time Tc of a cell and a delay time Tw of a route can be obtained as discussed below. The delay time Tc of a cell is obtained as the sum of a delay time K1 inherent in a cell and a value calculated by multiplying a driving capability K2 of cell output by a route capacitance C. Specifically, Tc=K1+K2×C. The delay time K1 inherent in the cell and the driving capability K2 of cell output are stored in the table in advance. The delay time Tw of a route is calculated by multiplying the route capacitance C by the route resistance value R. Specifically, Tw=R×C.

Thus, in the fourth preferred embodiment, since the delay time on the basis of the route length Ln of each net can be calculated, it is possible to reflect the netlist and improve the measurement accuracy as compared with that of the delay time obtained from the total route length. Also in the present preferred embodiment, the rough layout has only to be performed on a layout region having an adequate size and does not have to be performed on the layout region having a size to be measured, unlike in the conventional case. Therefore, the present preferred embodiment can be used in the initial stage of design where the size of the layout region is not determined yet and allows estimation of the delay time with high accuracy.

The Fifth Preferred Embodiment

Figure 6:
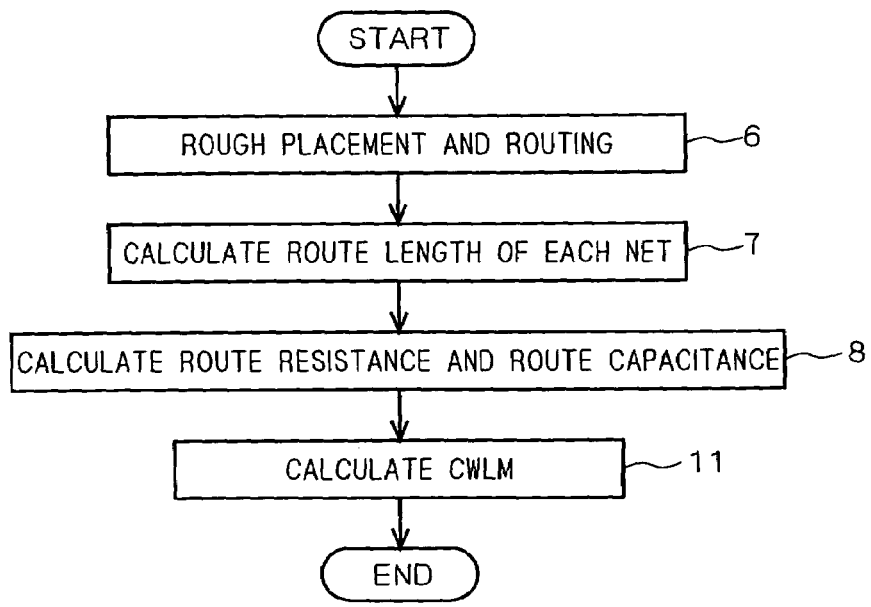
FIG. 6 is a flowchart showing a routing analysis method for an integrated circuit in accordance with a fifth preferred embodiment of the present invention.

Also in the fifth preferred embodiment of the present invention, like in the third preferred embodiment, it is possible to add a method of making a table associating the number of fanouts of a net with route capacitance which are used for a custom wire load model (hereinafter, referred to simply as CWLM) on the basis of the route length Ln of each net to the routing analysis method. FIG. 6 is a flowchart showing a method of making a CWLM for an integrated circuit in accordance with the fifth preferred embodiment.

In FIG. 6, the steps identical to those in FIG. 4 are represented by the same reference numerals. Step 6 to Step 8 are identical to those in the third preferred embodiment and therefore detailed discussion thereof will be omitted. In the fifth preferred embodiment, the CWLM for an integrated circuit is obtained on the basis of the route resistance and the route capacitance which are calculated in Step 8 (Step 11).

In Step 11, some methods for calculation which are conventionally well known can be used. For example, the route capacitance of a net having the number of fanouts N is calculated as a value obtained by averaging the route capacitance of all the nets in the number of fanouts N in the integrated circuit and then the table is made using the number of fanouts N and the calculated route capacitance.

Thus, in the fifth preferred embodiment, since the CWLM on the basis of the route length Ln of each net can be calculated, it is possible to reflect the netlist and improve the measurement accuracy as compared with that of the CWLM obtained from the total route length. Also in the present preferred embodiment, the rough layout has only to be performed on a layout region having an adequate size and does not have to be performed on the layout region having a size to be measured, unlike in the conventional case. Therefore, the present preferred embodiment can be used in the initial stage of design where the size of the layout region is not determined yet and allows estimation of the CWLM with high accuracy.

The Sixth Preferred Embodiment

Figure 7:
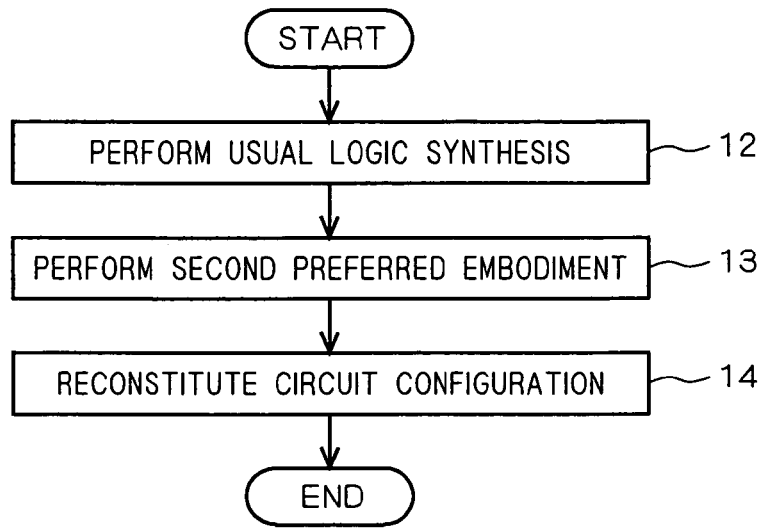
FIG. 7 is a flowchart showing a logic synthesis method for an integrated circuit in accordance with a sixth preferred embodiment of the present invention.

The sixth preferred embodiment of the present invention is a logic synthesis method for generating a netlist of an integrated circuit by using the routing difficulty index for a whole circuit of a hierarchical module and the routing difficulty index for a current layer circuit of the current hierarchical module which are discussed in the second preferred embodiment. FIG. 7 is a flowchart showing a logic synthesis method for an integrated circuit in accordance with the sixth preferred embodiment.

Referring to the flowchart of FIG. 7, first in Step 12, a netlist is generated by a logic synthesis method which is normally performed. The normally-performed logic synthesis method is a method for logic synthesis only in consideration of timing constraint violation and a cell area of a circuit. In the sixth preferred embodiment, a netlist is logically synthesized from, e.g., RTL (Register Transfer Level) circuit description. The RTL circuit description refers to a circuit description for defining a data transfer path by combining registers with a combinational circuit.

Then, the routing difficulty index for a whole circuit of a hierarchical module and the routing difficulty index for a current layer circuit of the current hierarchical module are calculated on the netlist obtained in Step 12 by using the method of the second preferred embodiment (Step 13).

If the routing difficulty indices for the hierarchical module obtained in Step 13 are larger than a predetermined value, a circuit configuration of the hierarchical module is reconstituted and then the logic synthesis is performed again to generate the netlist (Step 14). Herein, a possible predetermined value is an upper limit of the routing difficulty index restricted by, e.g., conditions of manufacture for the integrated circuit.

In Step 14, there may be various methods for reconstituting the circuit configuration of the hierarchical module. For example, a plurality of circuit configurations for implementing specific functions (e.g., addition and subtraction) of a circuit are prepared in advance, and if the routing difficulty index for a circuit of a hierarchical module is larger than a predetermined value, the circuit is replaced with one of the circuits which are prepared in advance. In a case of using this method, the routing difficulty index for each of the circuit configurations prepared in advance is obtained as discussed in the first preferred embodiment and this makes it possible to quickly select the circuit configuration which provides a smaller routing difficulty index for the netlist after reconstitution.

In the conventional method, the logic synthesis is performed only in consideration of timing constraint violation and a cell area of a circuit. For this reason, there is a case where the netlist generated by the conventional logic synthesis method is a netlist including a circuit having congestion of routes and in such a case, some problems arise, such as route short in placement and routing. Then, in the logic synthesis method of the sixth preferred embodiment, after the conventional logic synthesis method, a step of changing the circuit configuration is added if the routing difficulty index is larger than a predetermined value, to thereby solve the above problem.

Thus, in the sixth preferred embodiment of the present invention, since a step of changing the circuit configuration is added if the routing difficulty index is larger than a predetermined value, the logic synthesis method which prevents congestion of routes is achieved. Further in the present preferred embodiment, since reconstitution of circuit configuration is performed on the hierarchical module whose routing difficulty index is larger than the predetermined value, it is possible to prevent congestion of routes which locally occurs in the stage of generation of the netlist. Especially in a case of design where constraints are posed on the area of the layout region and a routing layer, since there is a strong possibility that routing can not be established in a portion having congestion of routes, the method of the present preferred embodiment is effective, which achieves the circuit configuration having the routing difficulty index which is lower than a certain standard in the stage of generation of the netlist.

The Seventh Preferred Embodiment

Figure 8:
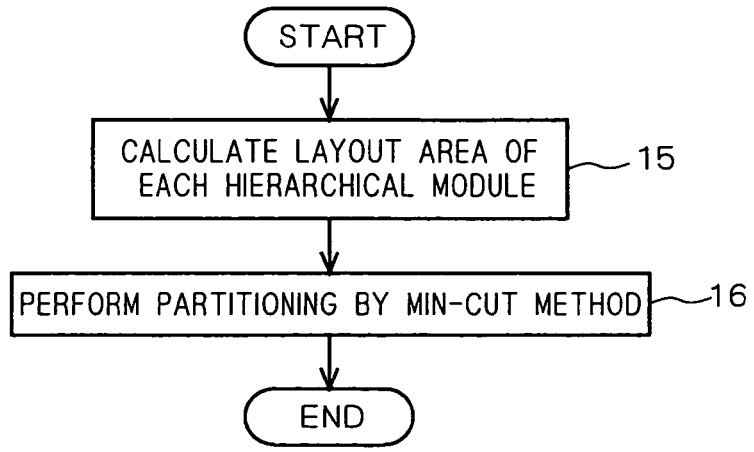
FIG. 8 is a flowchart showing a circuit partitioning method for an integrated circuit in accordance with a seventh preferred embodiment of the present invention.

The seventh preferred embodiment is a method of correcting the netlist on the basis of the layout area obtained by the method of the first preferred embodiment and partitioning an integrated circuit into a plurality of partial circuits. FIG. 8 is a flowchart showing a circuit partitioning method for an integrated circuit in accordance with the seventh preferred embodiment.

Referring to the flowchart of FIG. 8, first in Step 15, a layout area of each hierarchical module is obtained by using a method discussed below.

Figure 9:
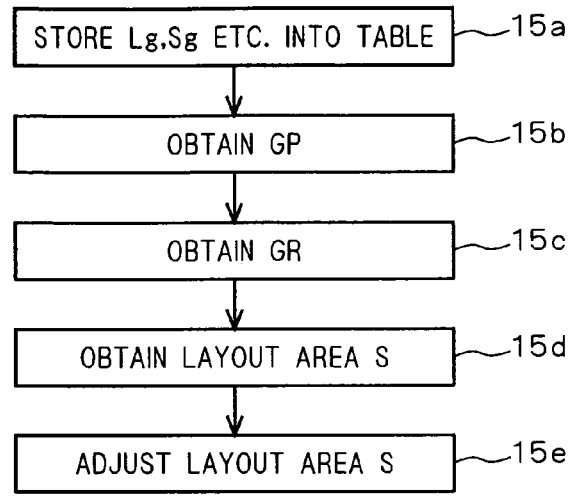
FIG. 9 is a flowchart showing a method for calculating a layout area of an integrated circuit in accordance with the seventh preferred embodiment of the present invention.

To obtain the layout area S of a hierarchical module, a method shown in the flowchart of FIG. 9 can be used. In the flowchart of FIG. 9, first, the number of grids occupied by a cell which is placed in the hierarchical module, the number of grids Lg per unit length of a route placed in the hierarchical module, the number of grids Sg per unit area and a grid usage ratio GU indicating a ratio of the number of grids occupied by the cells and the routes to the number of grids occupying a layout region are stored into a table (Step 15a).

Figure 10:
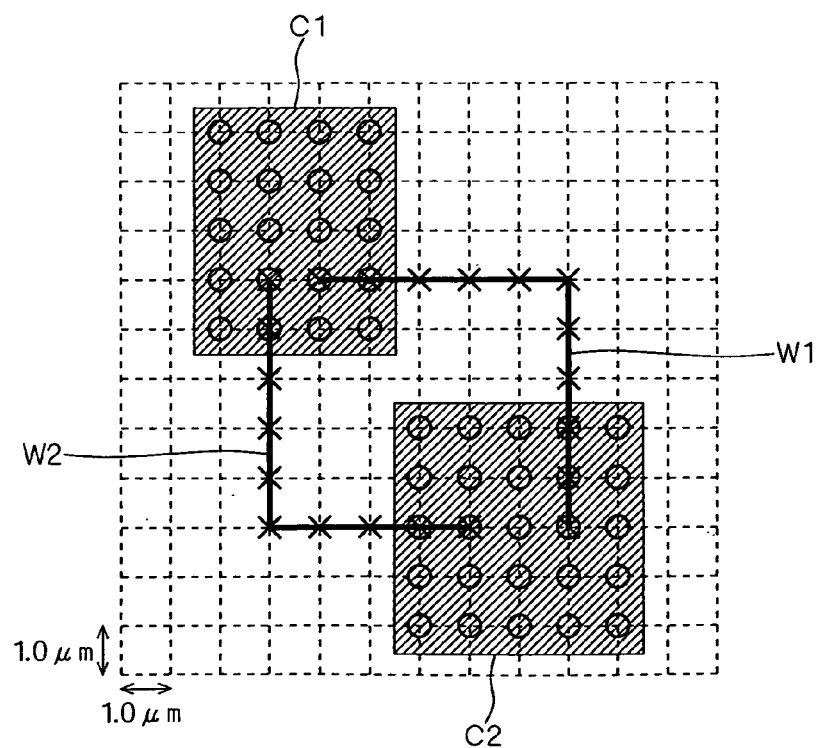
FIG. 10 is a circuit diagram showing an integrated circuit in accordance with the seventh preferred embodiment of the present invention.

For specific discussion, a circuit diagram of the integrated circuit is shown in FIG. 10. In FIG. 10, the number of grids occupied by a cell C1 is 20 and the number of grids occupied by a cell C2 is 25. Then, in FIG. 10, the number of grids Lg per unit length (1.0 μm) of a route is 1.0 and the number of grids Sg per unit area (1.0 μm×1.0 μm) is 1.0. Further, in FIG. 10, it is assumed that the grid usage ratio GU is 0.458.

In the flowchart of FIG. 9, next, the total number of grids GP occupied by the cells is obtained from the list of cells in the netlist and the number of grids occupied by a cell on the basis of the table (Step 15b). In the exemplary case of FIG. 10, there are cells C1 and C2 in the list of cells, and it is found from the table that the number of grids occupied by the cell C1 is 20 and the number of grids occupied by the cell C2 is 25. Therefore, the total number of grids GP is obtained as 20+25=45.

In the flowchart of FIG. 9, next, the total number of grids GR occupied by the routes is obtained from the connection information of routes in the netlist and the number of grids Lg on the basis of the table (Step 15c). In the exemplary case of FIG. 10, it is found from the connection information of the routes that the length of a route W1 is 11 μm and the length of a route W2 is 10 μm. Therefore, the total number of grids GR is calculated by multiplying the sum of the lengths of the routes W1 and W2 by the number of grids Lg per unit length, i.e., 1.0. Specifically, GR=(11+10)×1.0=21.

In the flowchart of FIG. 9, next, from the number of grids Sg per unit area, the grid usage ratio GU and the total numbers of grids GP and GR, the layout area S is obtained by calculation of (GP+GR)/Gu/Sg (Step 15d). In the exemplary case of FIG. 10, the layout area S=(45+21)/0.458/1.0=about 144 (μm$^2$).

Further, in the seventh preferred embodiment, for each hierarchical module, the layout areas S of a plurality of hierarchical modules positioned lower than the current hierarchical module are changed for adjustment with a uniform rate so that the sum of the layout areas S of the hierarchical modules positioned lower than the current hierarchical module becomes equal to the layout area S of the current hierarchical module (Step 15e).

In an exemplary case where the layout area of a hierarchical module is 100 μm$^2$ and the respective layout areas of a plurality of hierarchical modules positioned lower than the current hierarchical module are 45 μm$^2$ and 75 μm$^2$, the simple sum of the layout areas of the hierarchical modules positioned lower is 120 μm$^2$. Since the simple sum of the layout areas of the lower hierarchical modules is different from the layout area of the current hierarchical module, the layout areas of the lower hierarchical modules are reduced with a uniform rate. In the above case, the respective layout areas of lower hierarchical modules are changed into 45×100/120=37.5 μm$^2$ and 75×100/120=62.5 μm$^2$.

Next, the integrated circuit (netlist) whose layout area is changed in Step 15 is partitioned into a plurality of partial circuits (Step 16). To partition the integrated circuit into a plurality of partial circuits, for example, a min-cut method can be used. Herein, the min-cut method is a method by which the number of nets connecting the partial circuits after partitioning becomes as small as possible and the respective sizes of the partial circuits each fall within specified tolerance. In the seventh preferred embodiment, the min-cut method is performed on the basis of the layout areas changed in Step 15, not on the cell areas.

Conventionally, the min-cut method is performed on the basis of the cell areas. In this method, the cell area of each partial circuit which is obtained by partitioning is ensured to fall within specified tolerance but the layout area including an area occupied by routes in the partial circuit is not necessarily equal to the cell area and does not always fall within tolerance, and therefore it becomes necessary to perform repartition, correction of layout or the like. Then, in the seventh preferred embodiment, the min-cut method is performed on the basis of the layout area. Since partitioning is performed on the basis of the layout area in consideration of the routes or the like, the above problem can be solved.

Thus, in the seventh preferred embodiment, since the layout areas of a plurality of lower hierarchical modules are changed and then the integrated circuit is partitioned into a plurality of partial circuits on the basis of the changed layout areas, it is possible to reduce the necessity of performing repartition or the like.

The Eighth Preferred Embodiment

The integrated circuit usually consists of a plurality of function blocks. Among these function blocks, highly-versatile function blocks such as RAM are cataloged into a library on a function-block basis in order to be used for various applications. The cataloged function block is hereinafter referred to as a hard macrocell. The eighth preferred embodiment is a routing analysis method on a netlist including both the hard macrocells and standard cells (cells described in the first preferred embodiment).

Hereinafter, discussion will be made on a method of calculating the total route length L from the netlist including both the hard macrocells and the standard cells. Once the total route length L is obtained, the routing analysis method of the first to fifth preferred embodiments can be applied.

Figure 11:
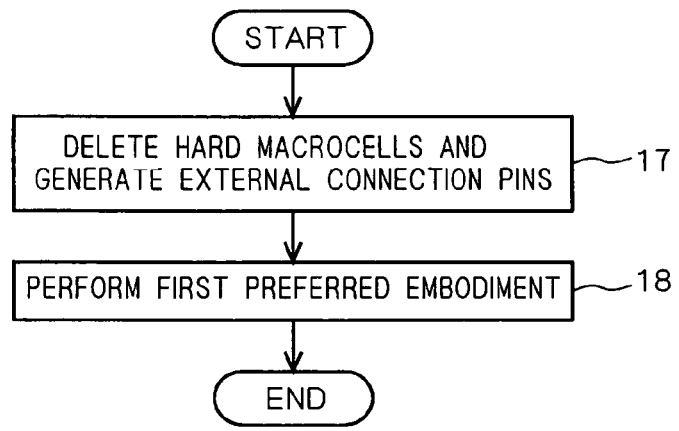
FIG. 11 is a flowchart showing a routing analysis method for an integrated circuit in accordance with an eighth preferred embodiment of the present invention.
Figure 12:
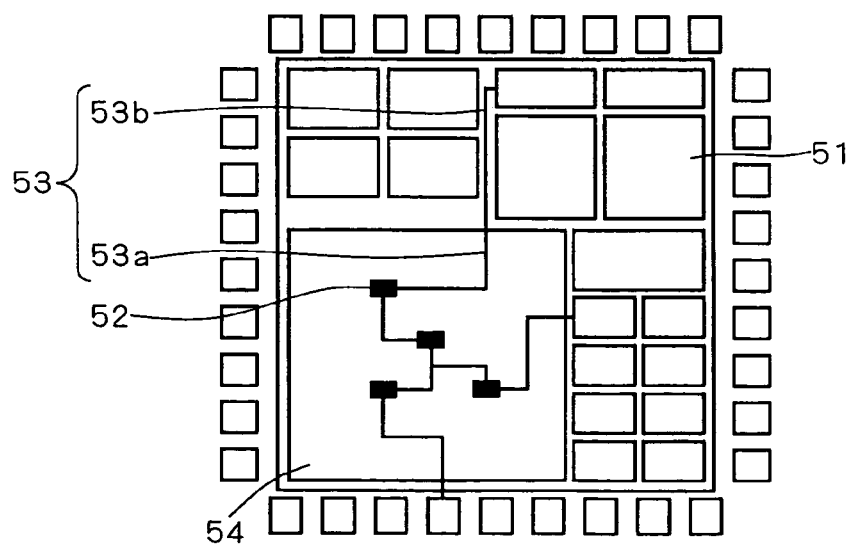
FIGS. 12 and 13 are views showing results of placement and routing for an integrated circuit in accordance with the eighth preferred embodiment of the present invention.

Referring to FIG. 11, first in Step 17, the hard macrocells are removed from the netlist to make a netlist including only the standard cells. Junctions between the netlist including only the standard cells and the hard macrocells are replaced with external connection pins. FIG. 12 is a view showing a result of placement and routing for an integrated circuit including both the hard macrocells and the standard cells. In FIG. 12, a circuit consists of hard macrocells 51, standard cells 52 and routes 53 connecting these cells. In FIG. 12, a region in which the standard cells 52 are provided is a standard cell placement region 54, the routes 53 in the standard cell placement region 54 are standard cell routes 53a and the other routes 53 are hard macrocell routes 53b.

Figure 13:
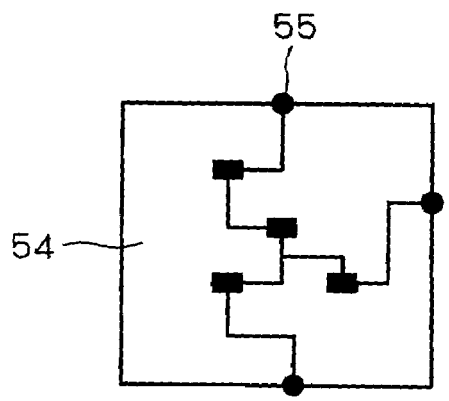

In Step 17, the hard macrocells 51 are removed from the netlist of the integrated circuit shown in FIG. 12 and only the standard cells are left. FIG. 13 is a view showing a result of placement and routing of a circuit including only the standard cells in a rectangular region. In FIG. 13, correction is made so that the routes 53 connected to the hard macrocells in FIG. 12 should be connected to newly-provided external connection pins 55.

As discussed above, in calculation of the total route length L from the netlist including both the hard macrocells and the standard cells, the reason why the hard macrocells are deleted and the total route length L is measured on the region including only the standard cells is that in many cases, generally, no route congestion occurs between the standard cells and the hard macrocells and if congestion occurs, it can be easily resolved by changing the placement positions of the hard macrocells.

Next, in Step 18, on the standard cell placement region 54 which is obtained in Step 17, the total route length L in the standard cell placement region 54 is calculated by using the method of the first preferred embodiment. When the total route length L is calculated by the method of the present preferred embodiment, the total route length of the routes 53 in the standard cell placement region 54 is a total route length of only the routes 53a up to the external connection pins 55. Therefore, it is possible to remove the hard macrocell routes 53b from the total route length to be obtained. Though the routing analysis method of the first preferred embodiment is used on the standard cell placement region 54 obtained in Step 17 in the eighth preferred embodiment, the present invention is not limited to that but other routing analysis methods may be used.

Thus, in the eighth preferred embodiment, since the hard macrocells are deleted from the netlist and the portions connected to the hard macrocells are replaced with the external connection pins, a routing analysis including the methods of the first to fifth preferred embodiments (for obtaining the routing difficulty index, the power consumption, the delay time and the CWLM) can be applied and the same routing analysis can be easily performed on the netlist including both the hard macrocells and the standard cells.

Further, to obtain the power consumption, the delay time and the CWLM for the whole integrated circuit, these are obtained for the hard macrocell region, and the result and the above result have to be combined. Even if the integrated circuit includes both the hard macrocells and the standard cells, conventionally, the same method is used for obtaining the power consumption, the delay time and the CWLM on the whole integrated circuit. In the hard macrocell region, however, unlike in the standard cell placement region 54, values of the power consumption, the delay time and the CWLM largely depend on the placement result of the hard macrocells. For this reason, to achieve higher accuracy, calculation for the hard macrocell region and that for the standard cell placement region 54 should be separately performed by using different methods. Then, in the eighth preferred embodiment, discussion will be made on application of the methods of the first to fifth preferred embodiments to calculation for the standard cell placement region 54.

Further, on the standard cell placement region 54 obtained in Step 17, the layout area can be calculated by using the method shown in FIG. 9 of the seventh preferred embodiment. Since the layout area of the hard macrocell region depends on factors other than congestion of routes, such as power supply lines, the layout area should be separately calculated by using a method different from that for the standard cell placement region 54, to achieve higher accuracy.

The integrated circuit including both the hard macrocells and the standard cells has a layout area obtained by combining the layout area for the standard cell placement region 54, which is obtained by the above method, and the layout area for the hard macrocell region, which is obtained by the different method. By applying the circuit partitioning method of the seventh preferred embodiment to calculation of this layout area, the method can be used on the integrated circuit including both the hard macrocells and the standard cells.

The Ninth Preferred Embodiment

The above preferred embodiments relate to the routing analysis method or the like on the netlist which is generated with no problem. The generated netlist, however, does not always have no problem, and there may be a case where an incomplete netlist or a defective netlist having a dropout portion is generated on some of the hierarchical modules. Then, in the ninth preferred embodiment, a routing analysis method on a defective netlist will be discussed.

Figure 14:
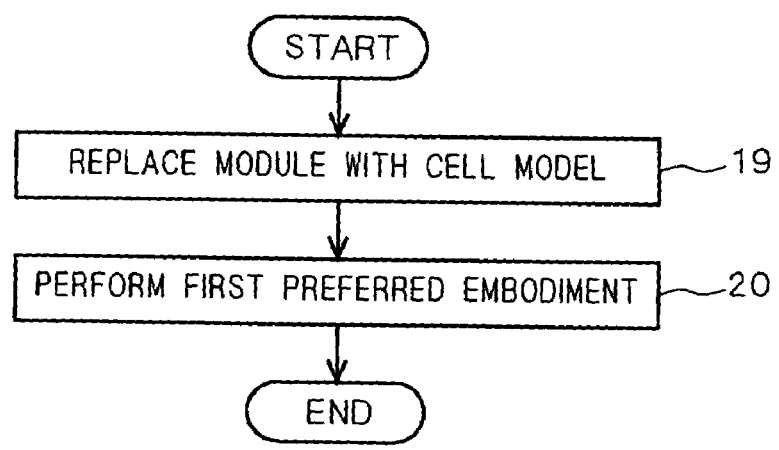
FIG. 14 is a flowchart showing a routing analysis method for an integrated circuit in accordance with a ninth preferred embodiment of the present invention.

FIG. 14 is a flowchart showing a routing analysis method for an integrated circuit in accordance with the ninth preferred embodiment of the present invention. Referring to the flowchart of FIG. 14, first in Step 19, the hierarchical module having a defective portion is replaced with a predetermined cell model. Herein, the predetermined cell model has a shape of square with a given cell area, where no route is allowed to pass over all the routing layers in the region.

Next, in Step 20, the routing analysis method of the first preferred embodiment is applied to a routing analysis from the netlist after replacing the hierarchical module having a defective portion with the predetermined cell model, to calculate the routing difficulty index.

Thus, in the ninth preferred embodiment, since the hierarchical module having a defective portion is replaced with the predetermined cell model, the routing analysis method of the first preferred embodiment can be applied to a routing analysis using the defective netlist.

Further, the methods of the second to seventh preferred embodiments can be applied to a routing analysis from the netlist after replacing the hierarchical module having a defective portion with the predetermined cell model.

While the invention has been shown and described in detail, the foregoing description is in all aspects illustrative and not restrictive. It is therefore understood that numerous modifications and variations can be devised without departing from the scope of the invention.

What is claimed is:

1. A routing analysis method for performing a routing analysis on an integrated circuit from a netlist, which is information on a plurality of cells constituting said integrated circuit and routes connecting said plurality of cells, comprising the steps of:
   (a) obtaining a sum of areas of said plurality of cells, a number of said plurality of cells or a number of said routes connecting said plurality of cells from said netlist, to be defined as a first constant, and calculating a layout area which is an area of a layout region, by dividing said first constant by a predetermined second constant;
   (b) calculating a total route length by multiplying a predetermined perimeter length of said layout region having said layout area obtained in said step (a) by a predetermined coefficient; and
   (c) calculating a routing difficulty index by dividing said total route length by said layout area.

2. The routing analysis method for an integrated circuit according to claim 1, wherein
   said predetermined coefficient is obtained by dividing said total route length, which is measured by roughly arranging said plurality of cells in said layout region having a predetermined half perimeter length, by said predetermined half perimeter length.

3. The routing analysis method for an integrated circuit according to claim 1, wherein
   said predetermined second constant is a numerical value indicating a ratio of an area of cells which are allowed to be arranged in said layout region to a unit area.

4. A routing analysis method for performing a routing analysis on an integrated circuit from a netlist, which is information on a plurality of cells constituting said integrated circuit and routes connecting said plurality of cells, comprising the steps of:

(a) obtaining a sum of areas of said plurality of cells, a number of said plurality of cells or a number of said routes connecting said plurality of cells from said netlist, to be defined as a first constant, and calculating a layout area which is an area of a layout region, by dividing said first constant by a predetermined second constant;

(b) calculating a route length of each net by multiplying a half perimeter length of said layout region by a predetermined coefficient of said each net and then obtaining a total route length by integrating said route length of said each net; and (c) calculating a routing difficulty index by dividing said total route length by said layout area.

5. The routing analysis method for an integrated circuit according to claim 4, wherein said predetermined coefficient is obtained by dividing said route length of said net, which is measured by roughly arranging said plurality of cells in said layout region having a predetermined half perimeter length, by said predetermined half perimeter length.

6. The routing analysis method for an integrated circuit according to claim 4, wherein said predetermined second constant is a numerical value indicating a ratio of an area of cells which are allowed to be arranged in said layout region to a unit area.

* * * * *